(12) United States Patent
Lai et al.

(10) Patent No.: US 8,134,486 B2
(45) Date of Patent: Mar. 13, 2012

(54) DAC CALIBRATION

(75) Inventors: Fang-Shi Jordan Lai, Chia-Yi (TW);
Yung-Fu Lin, Hsinchu (TW);
Kuo-Ming Wang, Hsinchu (TW);
Hsu-Feng Hsueh, Tainan (TW); Cheng Yen Weng, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 89 days.

(21) Appl. No.: 12/795,225

(22) Filed: Jun. 7, 2010

(65) Prior Publication Data

US 2011/0037631 A1     Feb. 17, 2011

Related U.S. Application Data

(60) Provisional application No. 61/234,503, filed on Aug. 17, 2009.

(51) Int. Cl.
*H03M 1/10* (2006.01)

(52) U.S. Cl. .................................. 341/120; 341/144
(58) Field of Classification Search ........... 341/120–160
See application file for complete search history.

(56) References Cited

U.S. PATENT DOCUMENTS

| 5,517,191 | A  | * | 5/1996  | Wynne ............... 341/118 |
| 5,818,370 | A  | * | 10/1998 | Sooch et al. ......... 341/120 |
| 6,501,405 | B1 | * | 12/2002 | Zhang et al. ......... 341/120 |
| 7,471,204 | B2 | * | 12/2008 | Safarian et al. ...... 340/572.1 |
| 8,031,098 | B1 | * | 10/2011 | Ebner et al. ......... 341/144 |

* cited by examiner

*Primary Examiner* — Lam T Mai
(74) *Attorney, Agent, or Firm* — Lowe Hauptman Ham & Berner, LLP

(57) ABSTRACT

Mechanisms to calibrate a digital to analog converter (DAC) of an SDM (sigma delta modulator) are disclosed. An extra DAC element in addition to the DAC is used to function in place of a DAC element under calibration. A signal (e.g., a random sequence of −1 and +1) is injected to the DAC element under calibration, and the estimated error and compensation are acquired.

21 Claims, 5 Drawing Sheets

DAC CALIBRATION

CROSS-REFERENCE TO RELATED APPLICATIONS

The present application claims priority of U.S. Provisional Patent Application Ser. No. 61/234,503 filed on Aug. 17, 2009 which is incorporated herein by reference in its entirety.

FIELD

The present disclosure is generally related to DAC (digital-to-analog converter) calibration.

BACKGROUND

DACs generally experience output noise that can cause inaccuracy in their sigma delta modulators and input to output non-linearity, and thus require calibration. A calibration approach to improve linearity uses spectral shaping to reduce in-band noise, but is ineffective for wide band (e.g., low OSR (over sampling rate) applications). Another approach requires an extra sigma-delta modulator for efficient calibration.

BRIEF DESCRIPTION OF THE DRAWINGS

The details of one or more embodiments of the disclosure are set forth in the accompanying drawings and the description below. Other features and advantages of the disclosure will be apparent from the description, drawings, and claims.

Like reference symbols in the various drawings indicate like elements.

DETAILED DESCRIPTION

Figure 1:
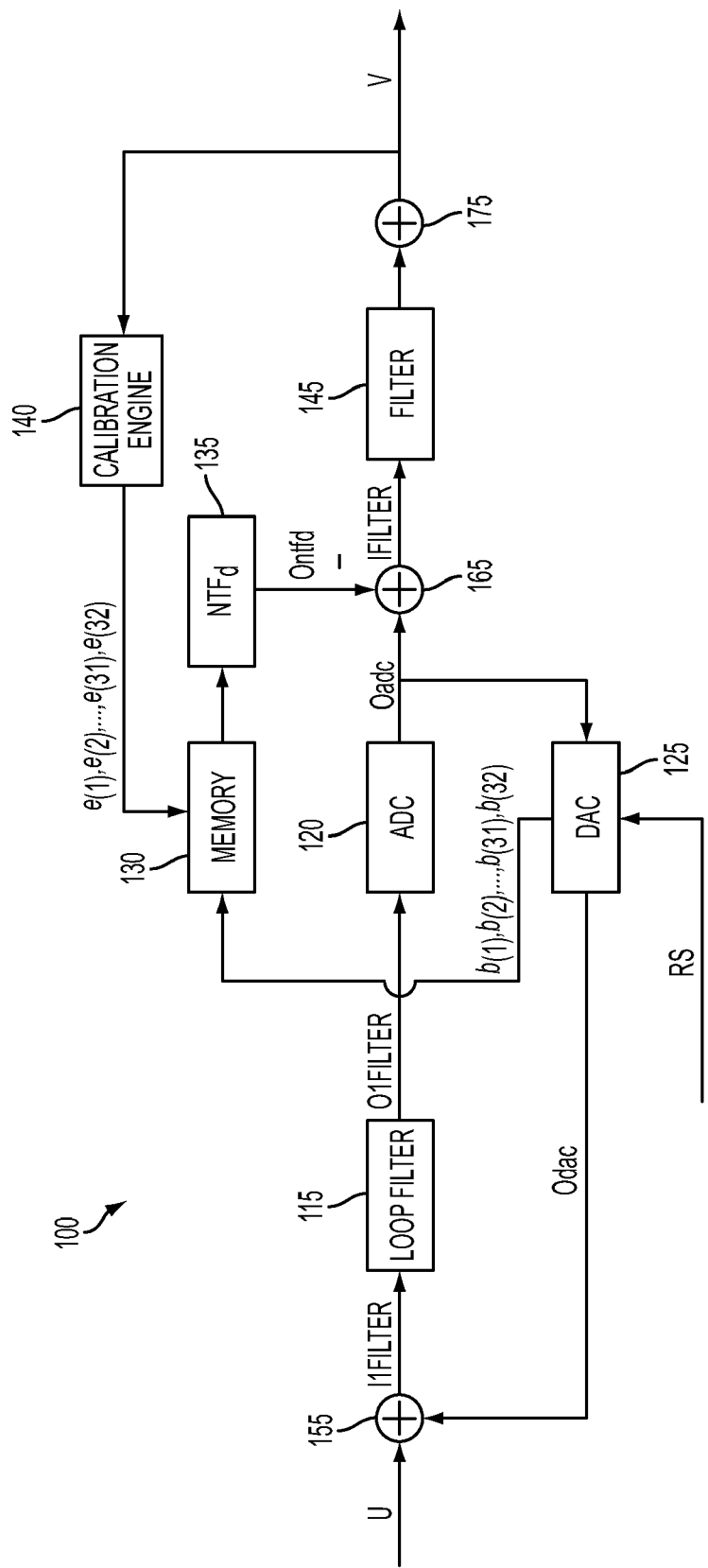
FIG. 1 shows a sigma delta modulator upon which various embodiments of the disclosure may be implemented.

Various embodiments, or examples, of the disclosure illustrated in the drawings are now described using specific language. It will nevertheless be understood that no limitation of the scope of the invention is thereby intended. Any alterations and modifications in the described embodiments, and any further applications of principles described in this document are contemplated as would normally occur to one skilled in the art to which the disclosure relates. Reference numbers may be repeated throughout the embodiments, but this does not necessarily require that feature(s) of one embodiment apply to another embodiment, even if they share the same reference number.

The Sigma-Delta Modulator

FIG. 1 shows an SDM (sigma delta modulator) 100 upon which various embodiments of the disclosure may be implemented. For illustration, a signal in the Z domain is referred to by a capitalized letter while a signal in the time domain is referred to by a non-capitalized letter. Signal U serves as the input for SDM 100 while signal V serves as the output for SDM 100.

Loop filter 115 filters quantization noise (e.g., noise in quantizer or ADC 120) to a high frequency band so that a low pass filter (not shown) can filter this noise. Loop filter 115 provides output signal O1filter.

ADC (analog-to-digital converter) 120 commonly referred to as a quantizer quantizes signal O1filter and includes multi-bit digital outputs. Those skilled in the art will recognize that the higher the number of bits ADC 120 outputs the higher the resolution the SDM 100 provides. FIG. 1 shows one ADC 120 illustrating a single-stage modulation, but the disclosure is not so limited. Additional ADCs 120 and associated circuitry (e.g., a loop filter compatible to loop filter 115, a filter compatible to filter 145, etc.) may be added to provide additional quantization levels for higher resolution. For example, an additional ADC (e.g., ADC 120(2)) may be added to quantize the noise of ADC 120 (e.g., the noise of the first stage) to provide a better quantization, and a filter (e.g., filter 145(2)) filters the output signal of this ADC 120(2) to provide a better resolution for SDM 100.

DAC 125 converts the digital output of quantizer 120 to an analog signal. Various embodiments of the disclosure inject a signal, e.g., signal RS, into DAC 125 to calibrate DAC 125. Various embodiments acquire accumulated and estimated errors for various elements of DAC 125 and use them to compensate for the output of SDM 100 and thus correct the DAC error. In an embodiment, signal RS includes a random sequence of −1 and +1. Thermometer code (e.g., code b(1), b(2), ..., b(32)) generated in DAC 125 is stored in memory or RAM 130 for use in error calculation and compensation/calibration.

Adder 155 adds signal U and signal Odac to provide an input signal I1filter to loop filter 115. Adder 155 serves as a tracking of input signal U passing through the modulation loop comprising loop filter 115, ADC 120, and DAC 125.

Calibration engine 140 provides the estimated errors for elements of DAC 125. Since DAC 125 in the embodiment of FIG. 1 includes 32 elements, DAC calibration engine 140 provides 32 estimated errors $e(1), e(2), e(3), \ldots, e(32)$ to be stored in RAM 130. In an embodiment the total estimated error for DAC 125 includes $b(1)*e(1)+e(2)*b(2)+ \ldots b(32)*e(32)$ wherein $e(1)$ to $e(32)$ represent the estimated errors and $b(1)$ to $b(32)$ represent the thermometer code for DAC elements 1 to 32 of the 5-bit DAC125.

Various embodiments of the disclosure provide mechanisms to calibrate SDM 100 in the foreground or background without affecting SDM 100's normal operation. Various embodiments provide an extra DAC element to SDM 100 to function in place of a DAC element under calibration. Depending on applications this extra DAC element may be switched in and out of DAC 115 for calibration or normal operation by switches and/or transistors. Various embodiments inject signal RS having a random sequence of −1 and +1 to the DAC element under calibration and acquire the accumulated estimated errors of the DAC elements under calibration and save them to RAM 130. Various embodiments then use the accumulated and estimated errors to compensate for SDM 100 output, taking account of other factors such as noise effect of the loop comprising DAC 125, loop filter 115 and ADC 120, etc.

Memory 130 (e.g., such as RAM) stores error estimation for calibration. Depending on applications, various embodiments calibrate each element in DAC 125, and the more elements DAC 125 includes, the more data is provided by calibration engine 140 and the more data is stored in RAM 130. The estimated and accumulated errors in RAM 130 are later used to calibrate DAC 125. In an embodiment, RAM 130 stores the total calibration value represented by $e(1)*b(1)+e(2)*b(2)+ \ldots e(32)*b(32)$.

NTF$_d$ 135 serves as a transfer function from output Odac of DAC 125 to output Oadc of ADC 120. Transfer function NTF$_d$ takes account of the effect of signal Odac passing through loop filter 115 and ADC 120 and provides appropriate compensation. For example, if NTF$_d$=Z$^{-2}$ implemented as a delay unit followed by another delay unit, then the estimated error at signal Odac, which includes e(1)*b(1)+e(2)*b(2)+ ... e(32)*b(32) and passes through loop filter 115 and ADC 120, is delayed by 2 delay units. For another example, if the transfer function is 2× (e.g., NTF$_d$=2), and if the signal Odac is e(1)*b(1)+e(2)*b(2)+ ... e(32)*b(32), then the output Ontfd is 2×(e(1)*b(1)+e(2)*b(2)+ ... e(32)*b(32)). Other effects transferred by transfer function NTF$_d$ 135 are within scope of embodiments of the disclosure.

Adder 165 subtracts signal Ontfd from signal Oadc and thus cancels and/or reduces the DAC error.

Filter 145 filters signal Ifilter to provide a better resolution for output signal V.

DAC Calibration

Figure 2:
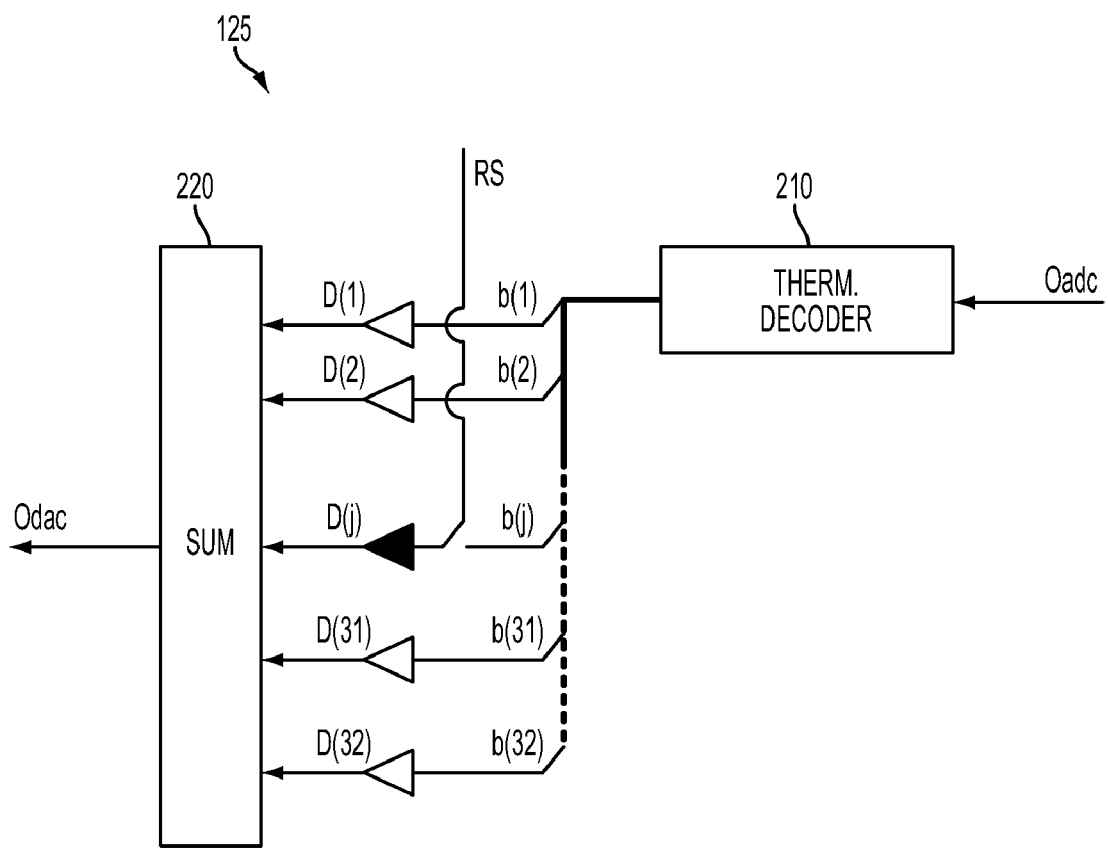
FIG. 2 shows the digital-to-analog converter of the modulator of FIG. 1, in accordance with an embodiment.

FIG. 2 shows a DAC 200 illustrating an embodiment of DAC 125. Generally, an M-bit DAC uses $2^M-1$ DAC elements D for the normal operation of the DAC. DAC elements D convert the digital signal to analog. In the example of M-bit DAC 200, $2^M-1$ DAC elements D provide $2^M$ levels from 0 to $2^M-1$ each of which corresponds to an analog value. As a result, the $2^M$ levels provided by $2^M-1$ DAC elements D correspond to analog values in the analog range to be converted (e.g., from −1V to 1V). Various embodiments of the disclosure provide an extra DAC element (e.g., DAC element D($2^M$)) for a total of $2^M$ DAC elements D so that DAC elements D may be calibrated. For illustration purposes FIG. 2 shows a 5-bit DAC 200 using 31 ($2^5-1$) DAC elements D with an extra DAC element D(32) for a total of 32 (e.g., $2^5$) DAC elements D.

Thermometer decoder 210 decodes the digital signal Oadc of the 5-bit DAC 200 into 32 thermometer codes b(1) to b(32), each corresponding to a DAC element D. Those skilled in the art will recognize that a thermometer code b includes a 0 or 1 value depending on the signal Oadc. For example, in a 5-bit ADC, there are 32 values of b for b(0) to b(31), and if Oadc has a value of 4 then b(0) to b(3) are 1, and the rest of the thermometer code b(4) to b(31) are 0. If Oadc has a value of 8 then b(0) to b(7) are 1, and the rest (e.g., b(8) to b(31)) are 0, and if Oadc has a value of 16 then b(0) to b(15) are 1, and the rest (e.g., b(16) to b(31)) are 0. Similarly, all b(0) to b(31) are 1 if Oadc has a value of 32.

In various embodiments, a DAC element D among the $2^M$ DAC elements D is selected for use in calibrating the other $2^M-1$ DAC elements D. For illustration purposes, this selected DAC element D is referred to as the calibration DAC element. For further illustration purposes, DAC element D(32) in DAC 200 is selected. Various embodiments then calibrate other DAC elements D(1) to D(31) by selecting one by one DAC element D. Once a DAC element D is selected to be calibrated (e.g., DAC element D(j)), various embodiments replace thermometer code b(32) of the calibration DAC element D(32) by thermometer code b(j) of the DAC element D(j) to be calibrated. As a result, DAC element D(32) replaces DAC element D(j), and together with other 30 DAC elements DAC element D(32) continues to perform the converting function of DAC 200. The index j is used to indicate that any DAC element may be selected for calibration. Embodiments of the disclosure are not limited to any order for selecting a DAC element to be calibrated.

Various embodiments then inject signal RS into DAC element D(j) under calibration and acquire the estimated error. In various embodiments, signal RS is a random sequence of −1 and +1 and serves as an input for calculating output signal V as follows:

$$V = U \cdot STF + NTF_q \cdot Q + NTF_d \cdot [RS \cdot (1+e_j)]$$

Where U is the input signal
STF is the signal transfer function from input signal U to output Oadc.
NTF$_q$ is the quantization noise transfer function to output Oadc.
Q is the quantization noise of ADC 120.
NTF$_d$ is the transfer function from Odac to Oadc.
RS is the random sequence of −1 and 1.
e(j) is the expected error for DAC element D(j).
In the time domain $$v_i = u*stf(i)(ntf_q*q)(i) + ntf_d[RS(1+e_{(j)})]]$$

Further, if E(x) is the expected error value of x where $$x = \left[\frac{1}{N}\sum_{i=1}^{N} RS_i \cdot v_i\right]$$

then $$E\left[\frac{1}{N}\sum_{i=1}^{N} RS_i \cdot v_i\right] = \frac{1}{N} \cdot E\left[\begin{array}{l} \sum_{i=1}^{N} RS_i \cdot (u*stf)(i) + \\ RS_i \cdot (q*ntf_q)(i) + \\ (1+e_{(j)}) \cdot RS(RS*ntf_d)(i) \end{array}\right]$$

With (RS$^2$*ntf$_d$)(i) being a constant k, RS is independent of q and u, then $$E[RS_i(u*stf)(i)] = E[RS_i] \cdot E[RSi] \cdot (q*ntfq)(i)] = 0$$

$$E[RS_i \cdot (u*stf)(i)] = E[RS_i] \cdot E(u*stf)(i)] = 0, \text{ and}$$

$$E(x) = x \text{ when } N \text{ is large enough}$$

or $$E\left[\frac{1}{N}\sum_{i=1}^{N} RS_i \cdot v_i\right] = \frac{1}{N}\sum_{i=1}^{N} RS_i \cdot v_i = (1+e_{(j)}) \cdot k$$

or $$e_{(j)} + 1 = \frac{1}{k} \cdot \frac{1}{N} \sum_{i=1}^{N} RS_i \cdot v_i$$

or $$e_{(j)} = \frac{1}{k} \cdot \frac{1}{N} \sum_{i=1}^{N} RS_i \cdot v_i - 1$$

For an example, if k=1, N=$2^3$ (e.g., 8), RS={−1, −1, +1, −1, +1, +1, +1, −1}, and E[RS]=0, then $$e(j) = \frac{1}{8}(-v1-v2+v3-v4+v5+v6+v7-v8)-1$$

Summation 220 provides the summation function. In an embodiment $$Odac = b(1) \cdot (1+e(1)) + b(2) \cdot (1+e(2)) + \ldots + b(32) \cdot (1+e(32))$$
$$= (b(1) + b(2) + \ldots + b(32)) + (b(1) \cdot e(1) + b(2) \cdot e(2) + \ldots + b(32) \cdot e(32))$$

where b(1)+b(2)+ ... +b(32) is the ideal value and b(1)·e(1)+b(2)·e(2)+ ... +b(32)·e(32) is the estimated error value for Odac. Alternatively stated, in an ideal situation (e.g., there is no error), e(1)=e(2)= ... =e(32)=0 and $$Odac = b(1)+b(2)+ \ldots +b(32)$$

Figure 3:
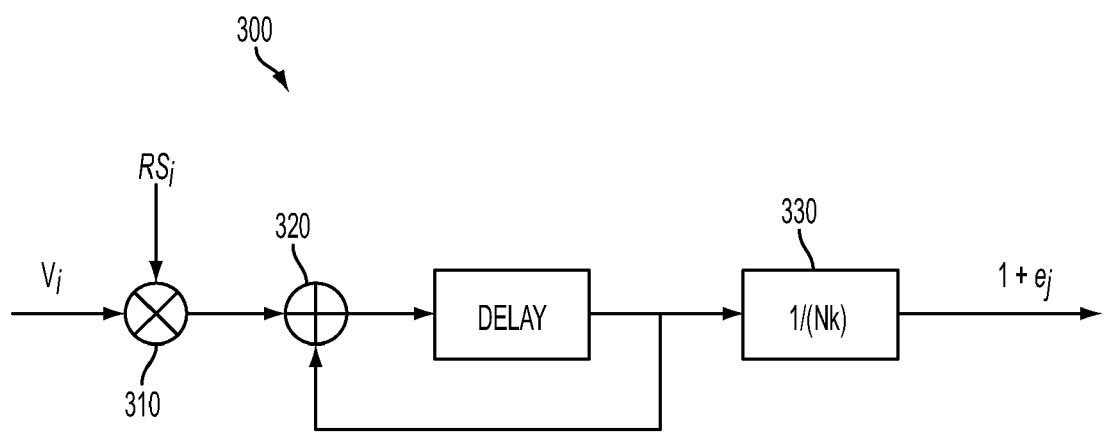
FIG. 3 shows a diagram representing an estimated error calculation in accordance with an embodiment.

FIG. 3 shows a diagram 300 illustrating error estimation in accordance with an embodiment. Diagram 300 shows a representation for e(j)+1 based on the equation $$e_{(j)} + 1 = \frac{1}{k} \cdot \frac{1}{N} \sum_{i=1}^{N} RS_i \cdot v_i$$

Multiplication 310 multiplies signals RS and v. Summation 320 accumulates the multiplied (RS·v) for N data points (e.g., from 1 to N). The value of N indicating the number of times the data points may be accumulated is chosen based on design choice. The larger the number N, the more accurate the error estimation is. The accumulated (RS·v) is divided by the constant N·k at block 330, resulting in e(j)+1.

Method Embodiment

Figure 4A:
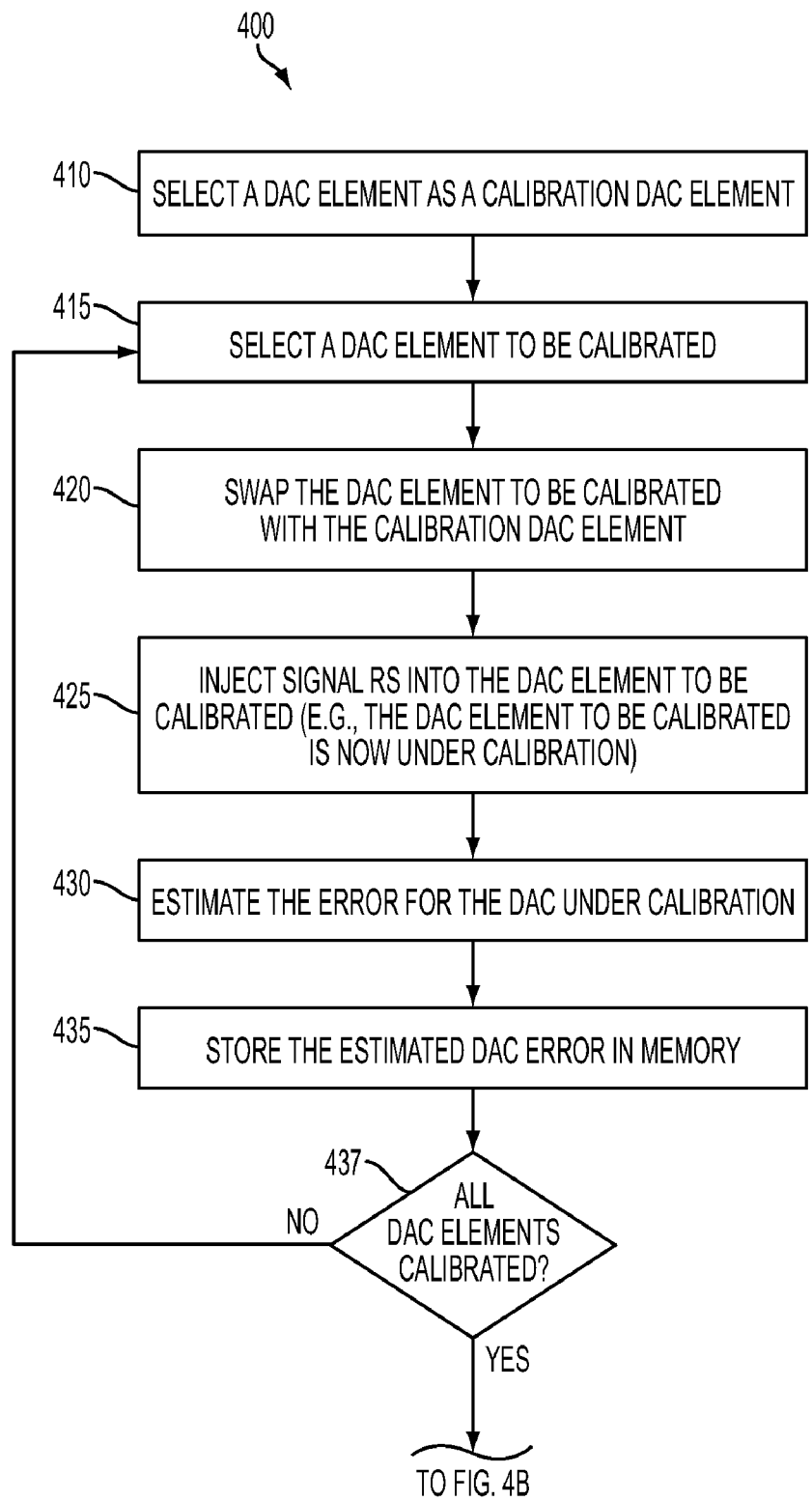
FIG. 4 shows a flowchart illustrating a method embodiment for calculating the estimated errors and compensation.
Figure 4B:
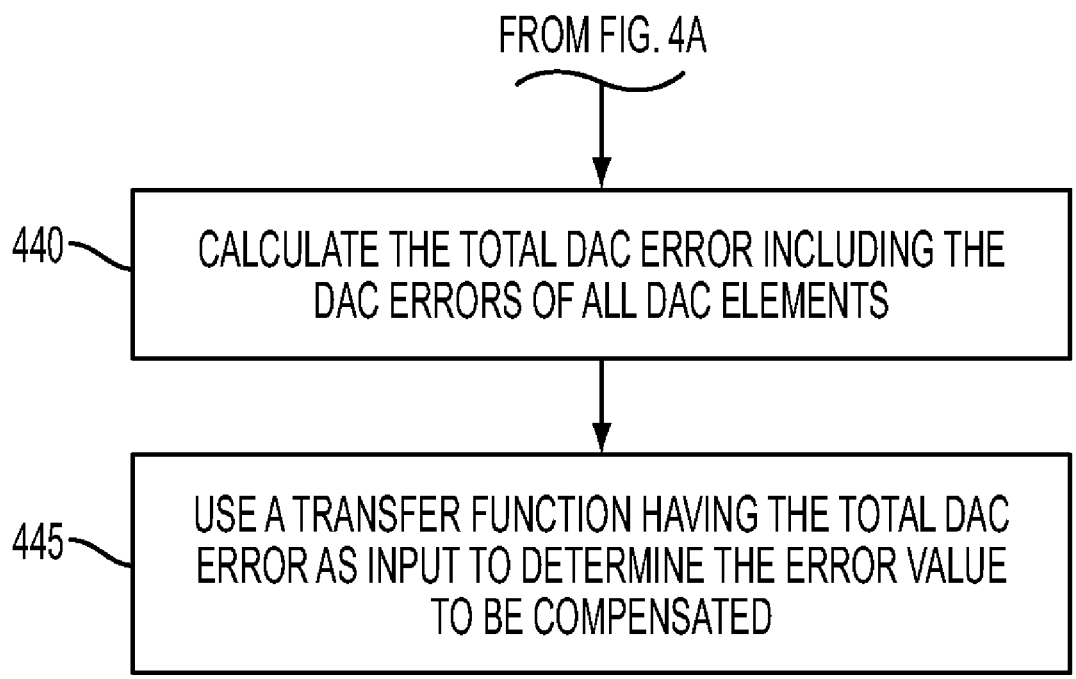

FIG. 4 shows a flowchart 400 illustrating a method embodiment for estimating errors and calibrating a DAC (e.g., DAC 125) using the above example where DAC 125 is a 5-bit DAC and thus includes $2^5$ (e.g., 32) DAC elements.

In block 410, a DAC element, e.g., DAC element D(32), is selected as a calibration DAC element. DAC element D(32) is selected for illustration purposes, any DAC element from DAC elements D(1) to D(32) may be selected.

In block 415, a DAC element, e.g., DAC element D(j), is selected to be calibrated. The index j indicates that any DAC element may be selected.

In block 420, DAC element D(j) is swapped with calibration DAC element D(32). In effect, calibration DAC element D(32) replaces DAC(j) for DAC element D(j) to be calibrated. In the mean time DAC element D(32) together with other DAC elements, continue to perform the normal function in a DAC. In an embodiment, thermometer code b(32) of calibration DAC element D(32) is replaced by thermometer code b(j) of DAC element to be calibrated D(j). As a result, DAC 125 continues to have the thermometer code b(1) to b(31) corresponding to 31 DAC elements D, allowing it to function as normal.

In block 425, signal RS is injected into DAC 125.

In block 430, estimated error e(j) is calculated for DAC element D(j) using the equation $$e_{(j)} + 1 = \frac{1}{k} \cdot \frac{1}{N} \sum_{i=1}^{N} RS_i \cdot v_i$$

In block 435 the estimated DAC error e(j) is stored in memory 130.

In block 437, it is determined if all DAC elements D have been calibrated. If not, the blocks 415, 420, 425, 430, and 435 are executed for another DAC element until errors for all DAC elements are estimated and stored.

In block 440, having the information in memory 130, the total DAC error is calculated as the sum of b(1)*e(1), b(2)*e(2), ... b(32)*e(32).

In block 445, a transfer function (e.g., transfer function $NTF_d$) having the total DAC error b(1)*e(1), b(2)*e(2), ... b(32)*e(32) as inputs provides a value to be compensated. The transfer function takes account of the effect of the loop filter 115 and ADC 120.

A number of embodiments of the disclosure have been described. It will nevertheless be understood that various modifications may be made without departing from the spirit and scope of the invention. For example, signal RS includes a random sequence of −1 and +1, but embodiments of the disclosure are not limited to these values, other values appropriately providing the estimated errors are within the scope of the invention. The method embodiment in FIG. 4 illustrate the transfer function is applied and compensation is provided to the estimated error value after 32 DAC elements are calibrated, but embodiments may use the transfer function and provide compensation after each error is estimated for a DAC element D. The above method embodiment shows exemplary steps, but these steps are not necessarily required to be performed in the order shown. Steps may be added, replaced, changed order, and/or eliminated as appropriate, in accordance with the spirit and scope of the invention.

What is claimed is:

1. A method comprising:
   using $2^M$ DAC elements for an M-bit digital-to-analog converter;
   selecting a first one of the $2^M$ DAC elements as a calibration DAC element;
   replacing a second one of the $2^M$ DAC elements to be calibrated with the calibration DAC element so that the remaining $2^M-2$ DAC elements and the calibration DAC element constitute $2^M-1$ DAC elements to function in the digital-to-analog converter;
   injecting a signal to the DAC element to be calibrated; and
   estimating a DAC error for the DAC element to be calibrated.

2. The method of claim 1 wherein the injected signal to the DAC element to be calibrated comprises a random sequence of −1 and 1.

3. The method of claim 1 wherein estimating the DAC error is based on an equation having the injected signal and an output signal of a sigma-delta modulator as inputs.

4. The method of claim 1 wherein estimating the DAC error is based on an equation $$e_{(j)} = \frac{1}{k} \cdot \frac{1}{N} \sum_{i=1}^{N} RS_i \cdot v_i - 1$$

where k is a constant, N is an iteration number, RS is the injected signal having a random sequence, and v is an output signal of a sigma delta modulator.

5. The method of claim 4 wherein the random sequence of the injected RS signal includes −1 and 1.

6. The method of claim 1 further comprising using a transfer function having the estimated DAC error as an input to provide an error value to be compensated.

7. The method of claim 6 wherein the transfer function is based on the estimated DAC error passing through one or a combination of a loop filter and an analog-to-digital converter.

8. The method of claim 1 wherein replacing the DAC element to be calibrated comprises providing a thermometer code of the DAC element to be calibrated as a thermometer code of the calibration DAC element.

9. The method of claim 1 further comprising storing the estimated DAC error in memory.

10. The method of claim 1 further comprising using a thermometer code of the DAC element to be calibrated and the estimated DAC error to compensate for the digital-to-analog converter.

11. The method of claim 10 further comprising using a transfer function having the thermometer code of the DAC element and the estimated DAC error as inputs in compensating for a sigma delta modulator using the digital-to-analog converter.

12. A method comprising:
using a plurality of DAC elements;
selecting a first one of the plurality of DAC elements as a calibration DAC element;
selecting a second one of the plurality of DAC elements as a DAC element under calibration;
replacing a thermometer code of the calibration DAC element with a thermometer code of the DAC element under calibration;
injecting a signal to the DAC element under calibration; and
using the signal injected to the DAC element under calibration and output of a sigma delta modulator to estimate an error for the DAC element under calibration.

13. The method of claim 12 further comprising using the estimated error for the DAC element under calibration and the thermometer code of the DAC element under calibration to compensate for the sigma delta modulator.

14. The method of claim 12 further comprising using a transfer function having the estimated error for the DAC element under calibration and the thermometer code of the DAC element under calibration as inputs to compensate for the sigma delta modulator.

15. The method of claim 14 wherein the transfer function takes account of a signal passing from an output of the DAC element under calibration passing through one or a combination of a loop filter and an analog to digital converter.

16. The method of claim 12 wherein the plurality of DAC elements includes $2^M$ DAC elements for an M-bit digital-to-analog converter.

17. The method of claim 12 wherein the signal injected to the DAC element under calibration includes a random sequence of −1 and 1.

18. The method of claim 12 wherein the estimated error for the DAC element under calibration is based on an equation $$e_{(j)} = \frac{1}{k} \cdot \frac{1}{N} \sum_{i=1}^{N} RS_i \cdot v_i - 1$$

where k is a constant, N is an iteration number, RS is the injected signal having a random sequence, and v is the output signal of the sigma delta modulator.

19. A method comprising:
using a plurality of DAC elements for a digital-to-analog converter used in a sigma delta modulator;
selecting a DAC element as a DAC element under calibration;
injecting a random-sequence signal to the DAC element under calibration; and
using the random-sequence signal injected to the DAC element under calibration and output of the sigma delta modulator to estimate error for the DAC element under calibration.

20. The method of claim 19 wherein the random sequence signal includes 1 and −1.

21. The method of claim 19 wherein the estimated error is based on an equation $$e_{(j)} = \frac{1}{k} \cdot \frac{1}{N} \sum_{i=1}^{N} RS_i \cdot v_i - 1$$

where k is a constant, N is an iteration number, RS is the injected signal having a random sequence, and v is the output signal of the sigma delta modulator.

* * * * *